(12) United States Patent
Watanabe et al.

(10) Patent No.: US 6,465,137 B2
(45) Date of Patent: *Oct. 15, 2002

(54) RESIST COMPOSITION AND PATTERN FORMING PROCESS

(75) Inventors: Keiji Watanabe; Miwa Kozawa; Ei Yano; Takahisa Namiki; Koji Nozaki; Junichi Kon; Eiichi Hoshino; Masahiro Uraguchi; Toshikatsu Minagawa; Yuichi Yamamoto, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/288,781

(22) Filed: Apr. 9, 1999

(65) Prior Publication Data

US 2001/0006752 A1 Jul. 5, 2001

(30) Foreign Application Priority Data

Apr. 13, 1998 (JP) ............................................ 10-115888

(51) Int. Cl.$^7$ .............................. G03F 9/00; G03C 5/00; G03C 1/76

(52) U.S. Cl. .......................... 430/5; 430/270.1; 430/313

(58) Field of Search .......................... 430/270.1, 280.1, 430/281.1, 191, 196, 905, 913, 917, 5, 313

(56) References Cited

U.S. PATENT DOCUMENTS

| | | | | |
|---|---|---|---|---|
| 4,587,203 A | * | 5/1986 | Brault et al. | 430/325 |
| 6,042,991 A | * | 3/2000 | Aoai et al. | 430/285.1 |
| 6,177,229 B1 | * | 1/2001 | Saito et al. | 430/270.1 |
| 6,187,504 B1 | * | 2/2001 | Suwa et al. | 430/270.1 |
| 6,238,842 B1 | * | 5/2001 | Sato et al. | 430/281.1 |

* cited by examiner

*Primary Examiner*—Mark F. Huff
*Assistant Examiner*—Saleha R. Mohamedulla
(74) *Attorney, Agent, or Firm*—Armstrong, Westerman & Hattori, LLP

(57) ABSTRACT

A resist composition comprising, in a resist, an additive which has a melting point of 160° C. or above, contains no aromatic ring, has a molecular size of no greater than 50 Å and is soluble in the developing solution for the resist, at 1–50 parts by weight with respect to 100 parts by solid weight of the resist, as well as a pattern forming process employing it. It thereby becomes possible to obtain high-resolution resist patterns.

7 Claims, 5 Drawing Sheets

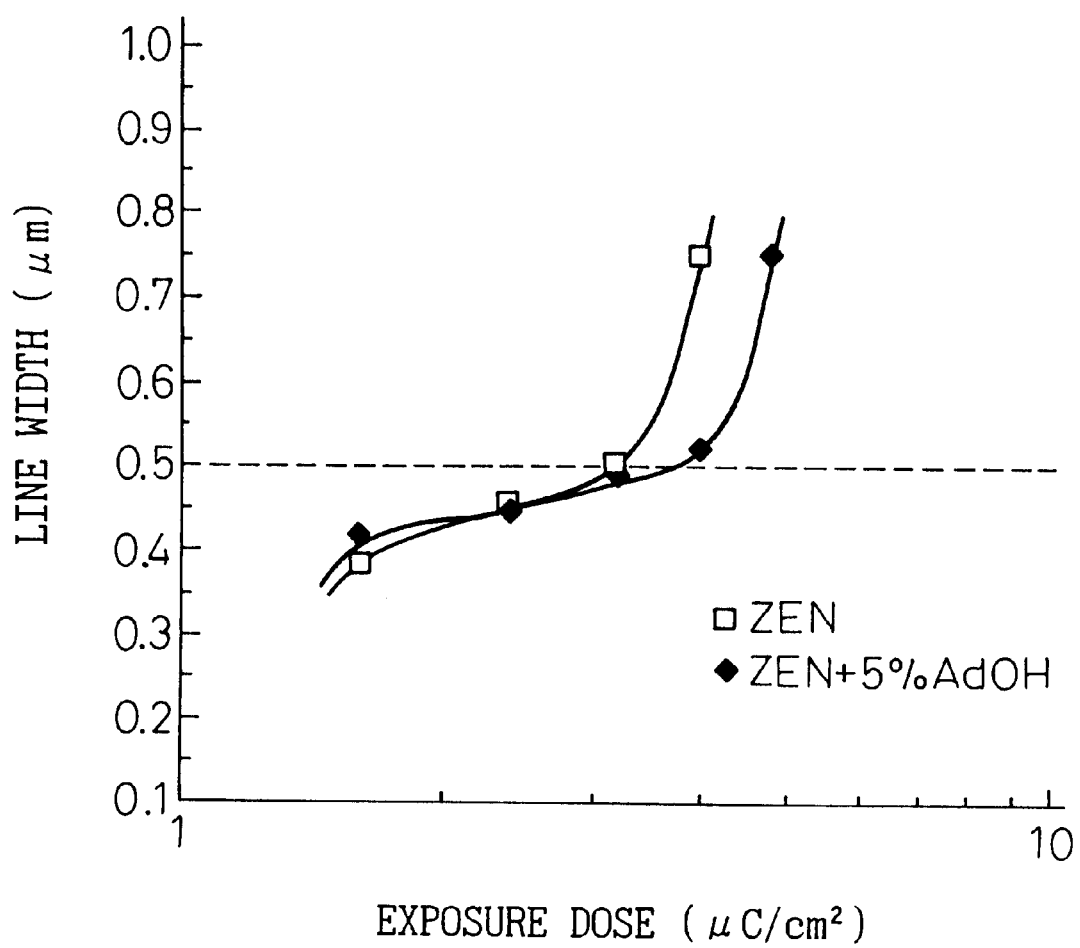

RESIST COMPOSITION AND PATTERN FORMING PROCESS

BACKGROUND OF THE INVENTION

1. Field of the Invention

The present invention relates to a resist composition for intricate pattern working required for production of photomasks and electronic devices, and to a pattern forming process and photomask production process employing the resist.

Electronic devices are exhibiting ever higher performance with greater miniaturization of circuit patterns. Miniature patterns are usually formed using photosensitive resin compositions known as photoresists. Specifically, a photoresist film is formed on a substrate and, after exposing a circuit pattern by radiation, it is developed to form the resist pattern, the pattern being then transferred to the target substrate by a method such as etching to form a circuit pattern on the substrate.

2. Description of the Related Art

Formation of high-precision circuit patterns requires a well-balanced resolution of the resist patterns after development. However, as circuit patterns become more miniaturized, it has become difficult to achieve such well-balanced resolution of resist patterns. For example, with copolymers of chloromethylstyrene and chlorostyrene in electron beam radiation negative-type resists used for production of photomasks, greater miniaturization of patterns results in problems such as roughness of the pattern edges due to the effects of forward scattering and back scattering of the electron beam in the resist film, and there is considerable production of substantial residues in the spaces.

SUMMARY OF THE INVENTION

It is therefore an object of the present invention to overcome such problems of the prior art by providing resist compositions and a pattern forming process employing them, whereby high resolution resist patterns can be obtained.

As a result of diligent research directed toward solving these problems, the present inventors have completed the present invention upon the finding that the resolution of resists can be improved by adding specific additives to the resists.

Specifically, the invention provides a resist composition comprising, in a resist, an additive which has a melting point of 160° C. or above, contains no aromatic ring, has a molecular size of no greater than 50 Å and is soluble in the developing solution for the resist, at 1–50 parts by weight with respect to 100 parts by solid weight of the resist.

According to the invention there is further provided a process for forming patterns comprising the steps of forming a film of the aforementioned resist composition on a target substrate, irradiating it with radiation, baking it if necessary, and then developing it. This pattern forming process can be advantageously applied to production of semiconductor apparatuses.

According to the invention there is still further provided a process for producing photomasks comprising the steps of forming a film of the aforementioned resist composition on a mask substrate, irradiating it with radiation, baking it if necessary, and then developing it and using the resulting resist pattern for etching of the mask substrate. Here, the term "photomask" is used in a wide sense to include reticle masks.

BRIEF DESCRIPTION OF THE DRAWINGS

FIG. 5 is a graph showing the relationship between the dimensions and the degree of exposure for a resist pattern obtained in the examples.

DESCRIPTION OF THE PREFERRED EMBODIMENTS

Figure 1:
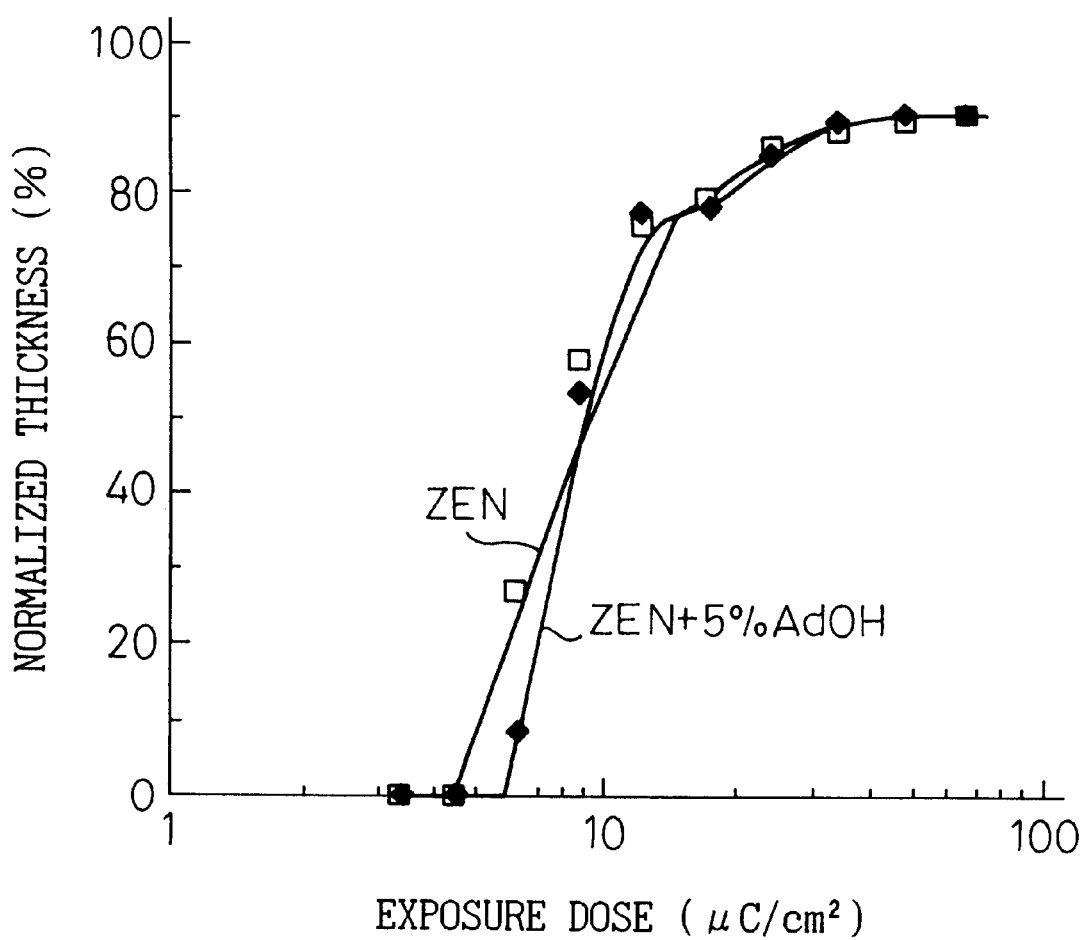
FIG. 1 is a graph showing a sensitivity curve for a resist pattern obtained in the examples.

The mechanism of improved resolution with the resist composition of the invention is not fully understood, but it is thought that the sufficiently small size of the molecules of the additive compared to the resolved pattern, coupled with the fact that it is a solid at normal temperature, favorably affects the resolution of the resist as a result of shape factors, heat resistance factors and solubility factors.

Here, the melting point of the additive is 160° C. or higher, and 250° C. or higher is particularly preferred. The melting point is preferably not lower than 160° C. to avoid deformation of the resist pattern by heat. Because the additive includes no aromatic rings, it may be favorably used from the standpoint of the transmittance characteristics of the resist. If it contains an aromatic ring it will have stronger absorbance to the exposure wavelengths of far ultraviolet rays, vacuum ultraviolet rays, etc., thus undesirably impairing the pattern shape. The size of the additive molecules is preferred to be no greater than 50 Å, and especially no greater than 10 Å. The molecules are preferably not larger than 50 Å because the edge shapes of the resist pattern will be affected by the size of the molecules during formation of miniature patterns, thus resulting in defects (roughness). The molecule size is also preferred to be at least 3 Å.

The radiation used for exposure of the resist is not particularly restricted, but preferred sources are ultraviolet rays (g rays, i rays), KrF excimer lasers, ArF excimer lasers, VUV, EUV, X-rays, electron beams, FIB and the like.

The resist used here may be of any type including negative, positive, chemical amplification, non-chemical amplification, organic development and alkali development types, etc., and the additive is selected for each, taking into account its solubility. For example, an organic development-type resist is preferably one which promotes solubility of the resist in the case of negative types, and which lowers it in the case of positive types. Especially preferred for alkali development are additives with polar groups such as a hydroxyl, carboxyl, sulfonate or amino groups, and the types and content of the polar groups are preferably controlled based on the resist type in order to promote or reduce the solubility of the resist. For chemical amplification resists, etc., it is especially preferred for the additive to not have a salt structure so that it will not aid diffusion of acids.

The amount of the additive is preferably 1–50 parts by weight, and especially 2.5–10 parts by weight, to 100 parts by solid weight of the resist. If it is added in a lower amount the effect of addition will be insufficient, and at a greater amount the resolution of the resist may be reduced instead.

As concrete examples of useful resists there may be mentioned chloromethylstyrene-chlorostyrene copolymer (organic development negative-type), chloroacrylate-methylstyrene copolymer (organic development positive-type), combinations of novolac resins and diazonaphthoquinone-based photosensitizers (alkali development positive-types), combinations of novolac resins or polyvinyl phenol and crosslinking agents or photoacid generators (alkali development chemical amplification negative-types), and combinations of polyvinyl phenol or acrylic resins wherein alkali-soluble polar groups are blocked with acid release-type protecting groups, and photoacid generators (alkali development chemical amplification positive-types).

The type of additive is not particularly restricted so long as it meets the conditions given above, but from the standpoint of heat resistance, molecular size, solubility, light transmittance and dry etching resistance, adamantane and its derivatives are preferred. Specifically there may be mentioned adamantane, adamantanone, adamantanol, adamantanecarboxylic acid, etc. Adamantane, for example, is suitable for the purpose of the invention because it has a melting point of 286° C., a molecular size of about 5 Å, ready solubility in non-polar solvents, high transmittance for ArF excimer lasers and other lithography light sources, and is polycyclic, and therefore has high dry etching resistance.

According to the invention, by adding an additive such as described above to the resist in an amount of 1–50 parts by weight to 100 parts by solid weight of the resist, it is possible to reduce residue of the resist while also improving the pattern shape and increasing the resolution.

The substrate on which the resist composition film is formed may include semiconductor substrates, insulating films, conducting films, LCD substrates, photomask substrates and the like.

The present invention will now be further explained by way of examples. These examples, however, are in no way intended to limit the scope of the invention.

EXAMPLE 1
[Sensitivity Characteristic (Contrast Improvement Effect)]

To 100 parts by solid weight of ZEN resist by Nihon Zeon (chloromethylstyrene-chlorostyrene copolymer) there was added 5 parts by weight of 1-adamantanol (AdOH), and after spin coating a Si substrate therewith to a film thickness of 0.3 μm, it was prebaked on a hot plate at 100° C. for 60 seconds. After exposure with an electron beam exposure apparatus at an acceleration voltage of 30 kV, it was developed with a mixed solvent of ethyl cellosolve and isoamyl acetate, and rinsed with ethyl cellosolve. The film thickness at the exposed sections was then measured with a contact needle-type film thickness meter, a film residue curve was drawn, and this was compared to a case where ZEN alone was used as the resist (FIG. 1). FIG. 1 shows that the resist containing adamantanol had enhanced contrast.

EXAMPLE 2
[Resolution (Residue Reducing Effect)]

Figure 2:
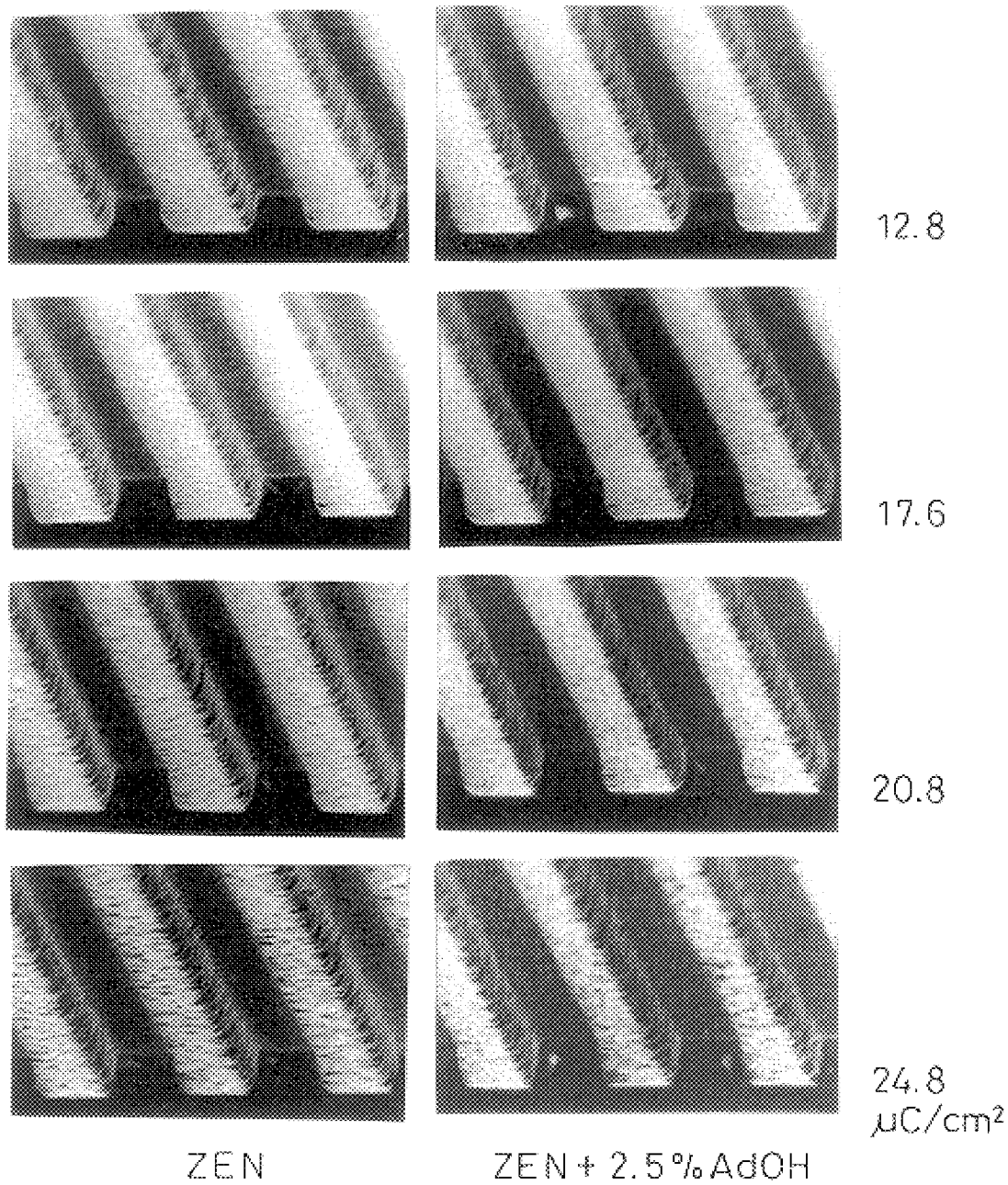
FIG. 2 is an electron micrograph of a resist pattern obtained in the examples.
Figure 3:
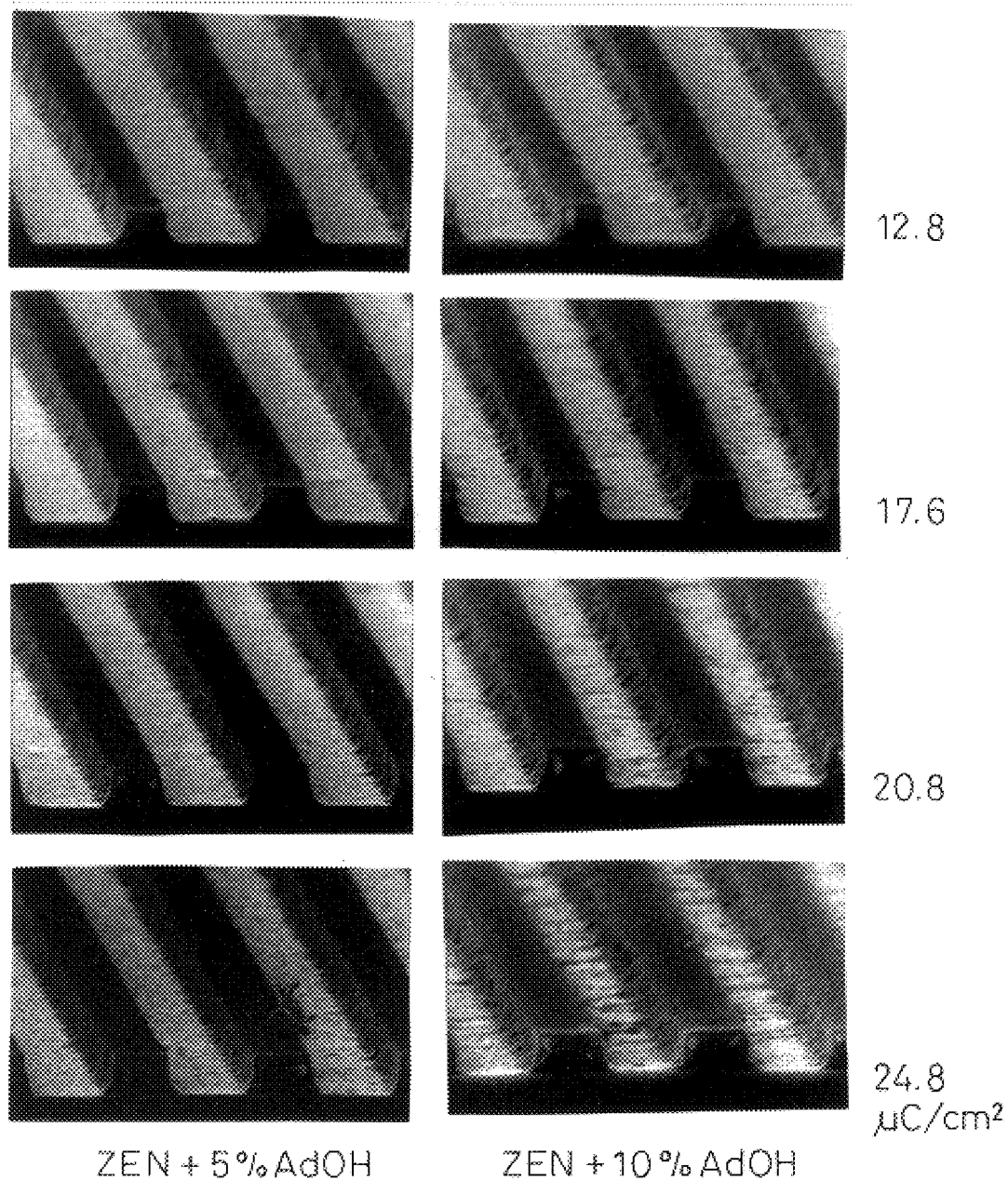
FIG. 3 is an electron micrograph of a resist pattern obtained in the examples.

To 100 parts by solid weight of ZEN resist by Nihon Zeon there were added 2.5 parts by weight, 5 parts by weight or 10 parts by weight of 1-adamantanol (AdOH) to fabricate resists, and afterspin coating Si substrates with each to a film thickness of 0.3 μm, the substrates were prebaked on a hot plate at 100° C. for 60 seconds. After exposure at 0.5 μm line and space with an electron beam exposure apparatus at an acceleration voltage of 30 kV, the substrates were developed with a mixed solvent of ethyl cellosolve and isoamyl acetate, and rinsed with ethyl cellosolve. The patterns were compared with a resist of ZEN alone, and observed with a scanning electron microscope (FIG. 2 and FIG. 3). FIG. 2 and FIG. 3 show that the resist with 2.5 parts by weight addition had lower residue than the resist with ZEN alone, while the 5.0 parts by weight resist had even lower residue. The resist with 10 parts by weight addition showed a tendency toward greater swelling.

EXAMPLE 3
[Resolution (Pattern Formation-improving Effect)]

Figure 4:
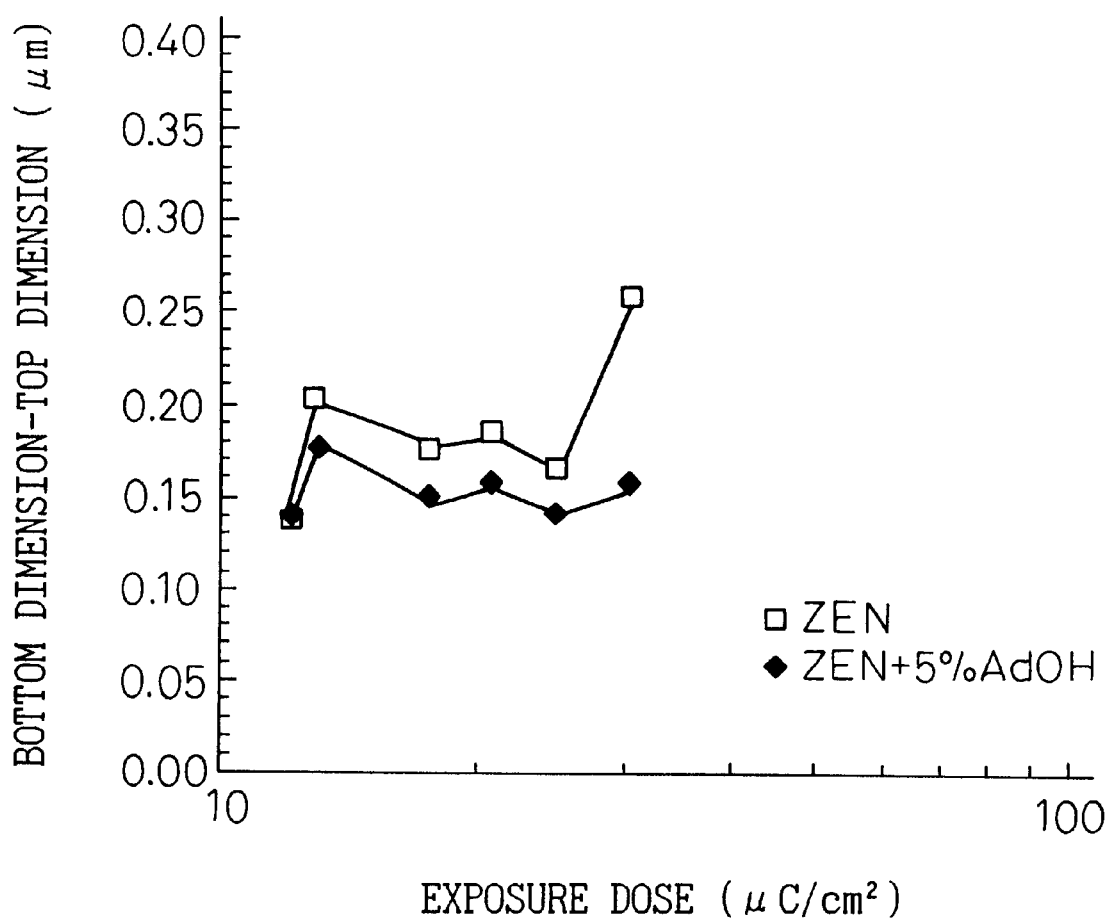
FIG. 4 is a graph showing the relationship between the bottom dimension and top dimension difference and the degree of exposure for a resist pattern obtained in the examples.

To 100 parts by solid weight of ZEN resist by Nihon Zeon there were added 5 parts by weight of 1-adamantanol (AdOH) to fabricate a resist, and after spin coating a Si substrate therewith to a film thickness of 0.3 μm, it was prebaked on a hot plate at 100° C. for 60 seconds. After exposure at 0.5 μm line and space with an electron beam exposure apparatus at an acceleration voltage of 30 kV, it was developed with a mixed solvent of ethyl cellosolve and isoamyl acetate, and rinsed with ethyl cellosolve. The pattern was compared with a resist of ZEN alone and observed with a scanning electron microscope, and the bottom dimension and top dimension of the pattern were measured. FIG. 4 is a graph showing the relationship between the value of the bottom dimension minus the top dimension (which is zero in the case of perfectly vertical side walls, so that smaller values indicate proximity to the ideal shape), and the degree of exposure. From FIG. 4 it is seen that the values are smaller for the additive resist at all degrees of exposure, indicating a better pattern shape.

EXAMPLE 4
[Resolution (Improvement in Dimension Exposure Margin)]

A resist was fabricated by adding 5 parts by weight of 1-adamantanol (AdOH) with respect to the solid weight of ZEN resist by Nihon Zeon (high sensitivity resist), and after spin coating a Si substrate therewith to a film thickness of 0.3 μm, it was prebaked on a hot plate at 100° C. for 60 seconds. After exposure at 0.5 μm line and space while varying the degree of exposure with an electron beam exposure apparatus at an acceleration voltage of 30 kV, it was developed with a mixed solvent of ethyl cellosolve and isoamyl acetate, and rinsed with ethyl cellosolve. The bottom dimension of the pattern was measured with a scanning electron microscope in comparison with a resist of ZEN alone (FIG. 5). From FIG. 5 it is seen that the resist with 5.0 parts by weight addition had a better dimension exposure margin than the resist with ZEN alone.

As explained above, according to the invention, it is possible to improve the resolution of resists, and thus vastly increase the reliability in electronic device and photomask production.

What is claimed is:

1. A resist composition comprising, in a resist, an additive, in the form of molecules which has a melting point of 160° C. or above, contains no aromatic ring, has a molecular size of no greater than 50 Å and is soluble in the developing solution for said resist, in an amount of 1–50 parts by weight with respect to 100 parts by solid weight of the resist composition, wherein the resist is a negative-working chloromethylstyrene/chlorostyrene copolymer.

2. A resist composition according to claim 1, wherein the additive is an alicyclic derivative.

3. A resist composition according to claim 2, wherein the additive has no salt structure.

4. A resist composition according to claim 1, wherein the additive is adamantane or its derivative.

5. A resist composition according to claim 4, wherein the additive is 1-adamantanol.

6. A pattern forming process comprising the steps of forming a film of a resist composition according to any one of claims 1 to 5 on a substrate, irradiating it with radiation, baking it if necessary, and then developing it.

7. A photomask production process comprising the steps of forming a film of a resist composition according to any one of claims 1 to 5 on a mask substrate, irradiating it with radiation, baking it if necessary, and then developing it and using the resulting resist pattern for etching of the mask substrate.

* * * * *